United States Patent
Tanaka (10) Patent No.: US 7,598,825 B2
(45) Date of Patent: Oct. 6, 2009

(54) FLAP RESONATOR, METHOD OF MANUFACTURING A FLAP RESONATOR, AND INTEGRATED CIRCUIT INCLUDING THE FLAP RESONATOR

(75) Inventor: Kazuaki Tanaka, Barcelona (ES)

(73) Assignee: Seiko Epson Corporation (JP)

( * ) Notice: Subject to any disclaimer, the term of this patent is extended or adjusted under 35 U.S.C. 154(b) by 281 days.

(21) Appl. No.: 11/582,947

(22) Filed: Oct. 17, 2006

(65) Prior Publication Data

US 2007/0090897 A1   Apr. 26, 2007

(30) Foreign Application Priority Data

Oct. 18, 2005   (EP)   ................... 05022647

(51) Int. Cl.
*H03H 9/02* (2006.01)
*H01L 29/40* (2006.01)

(52) U.S. Cl. ...................... 333/186; 257/415
(58) Field of Classification Search ................ 333/186, 333/188, 189, 105; 257/415, 416
See application file for complete search history.

(56) References Cited

U.S. PATENT DOCUMENTS 6,238,946 B1 * 5/2001 Ziegler .................. 438/50
6,870,444 B1 * 3/2005 Zurcher et al. .............. 333/186
2003/0085779 A1   5/2003 Ma
2005/0046518 A1   3/2005 Zurcher

FOREIGN PATENT DOCUMENTS

EP   1 585 219   4/2004

OTHER PUBLICATIONS

J. Yang, et al., Mechanical Behavior of Ultrathin Microcantilever, Oct. 7, 1999, p. 102-107.
K. Yasumura, et al., Quality Factors in Micro-and Submicron-Thick Cantilevers, Mar. 2000, p. 117-125.
S. Pourkamali, et al., High-Q Single Crystal Silicon HARPSS Capacitive Beam Resonators With Self-Aligned Sub-100-nm Transduction Gaps, Aug. 2003, p. 487-496.
Communication from European Patent Office regarding counterpart application, Apr. 24, 2006.

* cited by examiner

*Primary Examiner*—Benny Lee
*Assistant Examiner*—Alan Wong
(74) *Attorney, Agent, or Firm*—Harness, Dickey & Pierce, P.L.C.

(57) ABSTRACT

Flap resonator, comprising a first electrode and a second electrode, the second electrode comprising a support part separated from an adjacent end of the first electrode by a dielectric part, and a beam part extending from said support part and over at least a part of a surface of the first electrode. The support part has an effective width that is smaller than the width of the beam part.

20 Claims, 5 Drawing Sheets

FLAP RESONATOR, METHOD OF MANUFACTURING A FLAP RESONATOR, AND INTEGRATED CIRCUIT INCLUDING THE FLAP RESONATOR

FIELD OF THE INVENTION

The application relates to the field of resonators and, especially, to the field of MEMS (micro-electromechanical systems) resonators.

STATE OF THE ART

Micro-electromechanical systems (MEMS) are among the most promising technologies for implementing low-cost, low-power components for, for example, radio-frequency (RF) applications. The micrometric scale of MEMS devices and the possibility of integration can be useful to reduce the problems of the large areas occupied by passive components in conventional RF systems.

In this context, so-called MEMS resonators have been developed, comprising two semiconductor electrodes (made of, for example, silicon or polysilicon) that are capacitively coupled. When an electrical signal is applied to the electrodes, the resonator generates a resonance signal at its resonance frequency: the electrical signal induces a mechanical vibration of a part of the electrode arrangement, for example, of one of the electrodes, which starts to oscillate at its mechanical resonance frequency. This causes the capacitance of the electrode arrangement to change, whereby the system generates an electrical resonance signal.

A MEMS resonator can comprise two electrodes, one that can be "fixed" and one that comprises a member arranged so that it can vibrate when an electrical signal is applied to the electrodes. An example of such a resonator is disclosed in U.S. Pat. No. 6,870,444, wherein a beam part extends from an anchor part, said beam part having a distal end arranged so that it faces an opposing surface of the other electrode of the resonator. The vibrating movement corresponds to contractions/extensions of the beam, in its longitudinal direction between the anchor and the other electrode.

Figure 1A:
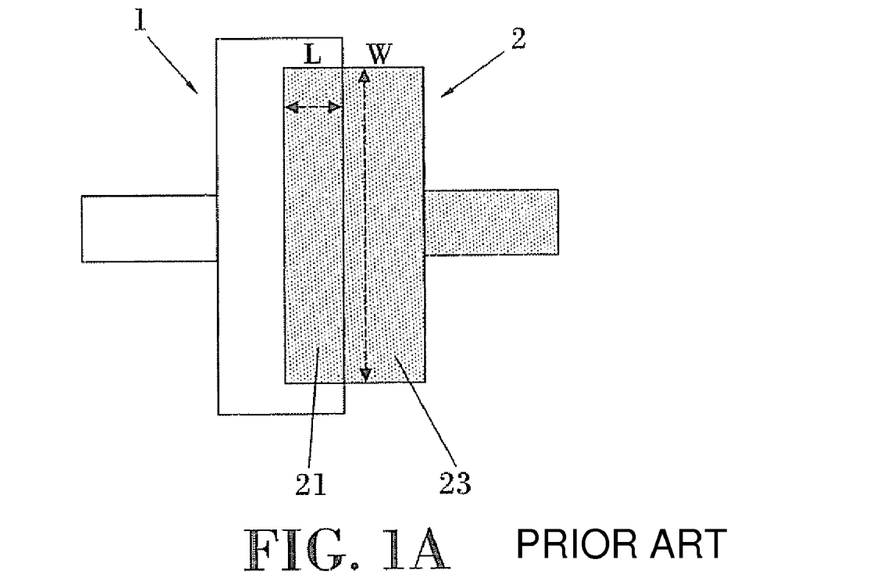
FIG. 1A: a top view of a prior art MEMS resonator.
Figure 1B:
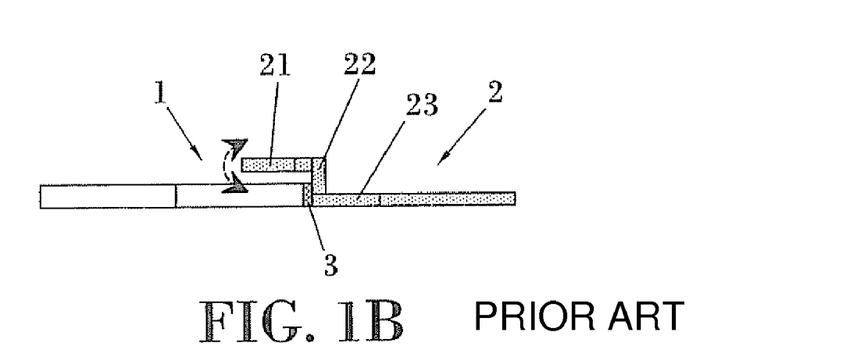
FIG. 1B: a cross section view of the MEMS resonator of FIG. 1A.

Another type of MEMS resonator is the so-called flap or micro-flap MEMS resonator. Such a resonator is shown in FIGS. 1A and 1B. It comprises a first electrode 1 and a second electrode 2. The first electrode 1 can be disposed fixed on a substrate (now shown), on which also a base part 23 of the other electrode can be disposed. Further, the second electrode comprises a beam part 21 offset from the base part 23 in a direction perpendicular to a major surface of the beam part, and connected to the base part 23 by a support part 22 forming part of the second electrode. Between said support part 22 and the adjacent end of the first electrode 1, there is a dielectric part 3, such as a dielectric strip or part of a dielectric layer (for example, a silicon dioxide layer) which provides for an electrical separation of the first and second electrodes.

The beam part 21 extends over at least a part of a surface of the first electrode 1, and there is a gap between said beam part and the corresponding surface of the first electrode, which allows the beam part 21 to vibrate (as illustrated schematically with the arrow in FIG. 1B). The area where the first 1 and second 2 electrodes overlap, that is, where the beam part 21 overlaps the underlying electrode 1, is an intrinsic MEMS resonator area, which has a width W and a length L. When an electrical signal is applied to the electrodes, the resonator generates a resonance signal at its resonance frequency: the electrical signal induces a mechanical vibration of the beam 21, the free end of which starts to oscillate vertically, at its mechanical resonance frequency. This causes the capacitance of the electrode arrangement to change, whereby the system generates an electrical resonance signal.

The first electrode 1 is typically made of silicon or polysilicon, and also the second electrode can be made of silicon or polysilicon; these materials are compatible with standard processes for semiconductor manufacture (such as standard CMOS and bipolar processes).

A problem involved with prior art micro-flap MEMS resonators is their comparatively low Q (quality)-factor, due to the damping effect of the support part, caused by mechanical friction. This tends to reduce the output resonance signal.

On the other hand, it has been found that the signals obtained from this kind of resonators can be very weak, not suitable for conventional oscillator applications. Thus, there exists a need to enhance the output resonance signal.

SUMMARY OF THE INVENTION

A first aspect of the invention relates to a flap or micro-flap resonator, comprising a first electrode (which can be made of silicon or polysilicon) and a second electrode (which can be made of silicon or polysilicon), the second electrode comprising a support part separated from an adjacent end of the first electrode by a dielectric part or strip, and a beam part extending from said support part and over at least a part of a surface of the first electrode, whereby there is a gap between said beam part and said surface of the first electrode, whereby the first electrode and the second electrode are arranged so that when an electrical signal is applied to said electrodes, the beam part will vibrate producing a varying capacitance between said beam part and the first electrode.

According to the invention, the beam part has a first width in a direction parallel to its connection to the support part, and the support part has an effective width in said direction, said effective width being smaller than said first width. That is, the support part is not continuous all along the full width of the beam part. This provides for an enhanced output resonance signal, and/or for an improved Q-factor, for the following reasons:

The micro-flap resonator is the same type of resonator as a cramped-free beam resonator. The support Q-factor of a cramped-free beam resonator can be expressed as $$Q_{SUPPORT} \approx 2.17\left(\frac{L}{W}\right)^3$$

where L is the length and W the width of the cramped-free beam (micro-flap) resonator as shown in FIG. 1A (cf. S. Pourkamali, et al., "*High-Q Single Crystal Silicon HARPSS Capacitive Beam Resonators With Self-Aligned Sub-*100-*nm Transduction Gaps,*" *J. Microelectromech. Syst.*, vol. 12, pp. 487-496, August 2003.). That is, the support Q-factor of this resonator is proportional to length of the beam and inversely proportional to width (the total Q-factor is affected from several damping effects; the support Q-factor is related to the damping effect of the support). Thus, to increase the Q-factor, a possible approach would be to increase the length and reduce the width of the resonator. However, reducing the width of the resonator, including the width of the vibrating part, would provide a decrease in the output signal (the electrical charge that can be stored in the beam part increases with the width of the beam part, and the level of the output signal increases with the level of the electrical charge stored in the beam part). However, this negative effect can be avoided if only the width (or, rather, the effective width, that is, the accumulated total width) of the support part is reduced.

Figure 2:
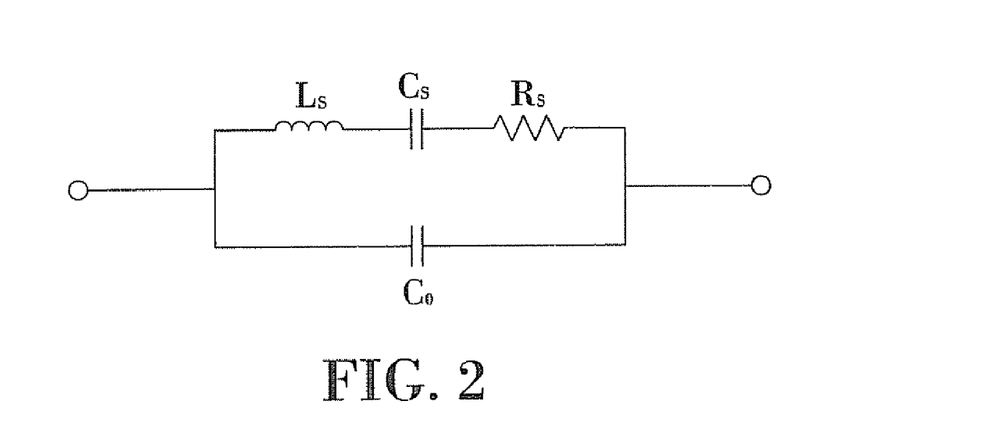
FIG. 2: an electrical equivalent circuit model for a MEMS resonator.

On the other hand, the electrical equivalent circuit model of a MEMS resonator can be expressed as shown in FIG. 2, where $L_s$ is the inductance of the equivalent circuit of the resonator, $C_s$ is the capacitance of the equivalent circuit of the resonator, and $R_s$ is the series motional resistance, while $C_0$ is the static overlap capacitance between the two electrodes of the resonator, and thus determined by, inter alia, the size of resonator. In the case of a micro-flap resonator such as the one of FIGS. 1A and 1B, $C_0$ is influenced by the area where the beam part 21 and the support part 22 overlap the surface of the first electrode 1 (cf. FIG. 1B). There is no silicon dioxide layer remaining between the beam part 21 and the first electrode, thus, the main contribution to $C_0$ comes from the part of the support or sidewall part where the dielectric strip or part (made of, for example, silicon dioxide ($SiO_2$)) is present between the two electrodes (as the dielectric constant $\in_{ox}$ of said dielectric part—which can be a part of a corresponding silicon dioxide layer—is larger than the dielectric constant of air ($\in_0$): $\in_{ox} > \in_0$).

$C_0$ has been found to affect the resonator performance: a high $C_0$ implies a high resonator capacitance. Thus, by reducing $C_0$, the output resonance signal can be enhanced. In accordance with the invention, this is achieved by reducing the effective width of the support part, thus reducing the area of the electrode in the area with the largest dielectric constant ($\in_{ox}$) between the first and second electrodes; this area corresponds to the dielectric strip or part between the support part of the second electrode and an adjacent end of the first electrode.

The support part can comprise one single support portion that is continuous in a direction parallel to its connection to the beam part, whereby the effective width is the width of said single support portion. The support portion can, for example, be situated centrally with regard to the extension of the beam part along its width.

Alternatively, the support part can comprise a plurality of support portions arranged in a row along the direction parallel to their connection to the beam part, said support portions being separated from adjacent support portions by gaps, whereby the effective width is the sum of the widths of the plurality of support portions. That is, instead of one single support portion, there can be a plurality of small support portions separated by gaps, whereby the accumulated or total width of said support portions will be smaller than the width of the beam.

The effect obtained by the invention will basically increase with a decreasing "effective width" of the support portion. On the other hand, the width should be sufficient so as to guarantee a sufficient mechanical support of the beam. In any case, an effective width that is less then 50% of the width of the beam part, for example, less than 25% of the width of the beam part, can be adequate.

The second electrode can further comprise a base part extending from said support part; the beam part can be displaced from the base part in a direction perpendicular to a major surface of the beam part, that is, the beam part and the base part can be at "different levels" in the layered structure making up the resonator.

The support part can have said effective width, smaller that said first width, at least in a part of (or even in the entirety of) an area that is in contact with the dielectric strip (whereby the reduced width especially contributes to reduce the capacitance between the first and second electrodes) and/or the support part can have said effective width, smaller that said first width, at least in a part of an area that is not in contact with the dielectric strip (then, the reduced width may primarily serve to increase the Q-factor of the resonator).

The dielectric part can be part of a layer, such as a silicon dioxide layer, provided for electrically insulating the second electrode with regard to the first electrode.

One of the first electrode and second electrode can be made of a p-type doped semiconductor material, whereas the other one of said first electrode and second electrode can be made of an n-type doped semiconductor material. Thereby, the output signal current can be increased, as explained below:

The electric charge per unit between semiconductor electrodes of a MEMS resonator can be calculated as $q = C_o(V_P - V_{FB} - 2\phi_f)$ $V_{FB} = \phi_{AB}$ (where $C_0$ is the static capacitance between the two electrodes, $V_P$ is a DC bias voltage between the two electrodes, $V_{FB}$ is the flat-band voltage, $\Phi_f$ is the Fermi potential, and $\Phi_{AB}$ is the built-in potential between two facing semiconductor electrodes).

In conventional arrangements, wherein both electrodes consist of material doped in the same way, (that is, or p-type and p-type, or n-type and n-type semiconductor materials), the built-in potential $\Phi_{AB}$ is $$\phi_{AB} = \frac{E_g}{2} - \frac{kT}{2}\ln\left(\frac{N_A}{n_i}\right)$$

(where $E_g$ is the energy band-gap of the semiconductor, $N_a$ is the doping density of the bottom side (reference) semiconductor electrode, k is Boltzman constant, T is temperature, and $n_i$ is intrinsic density of semiconductor). Then, the electric charge of the electrode is:

$$q_1 = C_o(V_P - (\phi_{AB}) - 2\phi_f)$$
$$= C_o\left(V_P - \left(\frac{E_g}{2} - \frac{kT}{2}\ln\left(\frac{N_a}{n_i}\right)\right) - 2\phi_f\right)$$
$$= C_o\left(V_P - \frac{E_g}{2} + \frac{kT}{2}\ln\left(\frac{N_a}{n_i}\right) - 2\phi_f\right)$$

However, if the electrodes are made up of differently doped materials (for example, of a p-type and n-type semiconductor material, respectively), the built-in potential $\Phi_{AB}$ will be $$\phi_{AB} = -\frac{E_g}{2} - \frac{kT}{2}\ln\left(\frac{N_a}{n_i}\right)$$

Then, the electric charge of the electrode will be $$q_2 = C_o(V_P - (\phi_{AB}) - 2\phi_f)$$
$$= C_o\left(V_P - \left(-\frac{E_g}{2} - \frac{kT}{2}\ln\left(\frac{N_a}{n_i}\right)\right) - 2\phi_f\right)$$
$$= C_o\left(V_P + \frac{E_g}{2} + \frac{kT}{2}\ln\left(\frac{N_a}{n_i}\right) - 2\phi_f\right)$$

From above formulae, the difference of the charge of the electrodes, that is, the difference between $q_1$ and $q_2$, can be determined:

$$q_2 - q_1 = C_0 \left( V_P + \frac{E_g}{2} + \frac{kT}{2} \ln\left(\frac{N_q}{n_i}\right) - 2\phi_f \right) -$$
$$\left( C_0 \left( V_P - \frac{E_g}{2} + \frac{kT}{2} \ln\left(\frac{N_a}{n_i}\right) - 2\phi_f \right) \right)$$
$$= C_0 E_g$$

Thus, it can be observed that a resonator having one electrode made of a p-type semiconductor material and the other electrode made of an n-type semiconductor material, will be able to accumulate electric charge to a larger extent than the prior art resonators in which both electrodes are doped in the same way.

Considering a capacitive MEMS resonator having, at the resonance frequency, an impedance $R_x$; the resonator will generate an output signal current that can be calculated as:

$$i_o = V_P \cdot \left| \frac{\partial C}{\partial x} \right| \cdot \frac{\partial x}{\partial t} \cong V_P \cdot \left( \frac{\varepsilon_0 A_0}{d_0^2} \right) \cdot (\omega_0 X)$$

where $A_0 = LW$ is the resonator overlap area (cf. for example FIGS. 3 and 4), $d_0$ is the gap spacing between the two electrodes, $\partial C / \partial x$ is the change of resonator capacitance per unit displacement, $X$ is the amplitude of vibration, and $\omega_0 = 2\pi f_0$ is the radian resonance frequency, and $\varepsilon_0$ is dielectric constant.

The static capacitance of the resonator is $$C_0 = \frac{q}{V_P} = \frac{\varepsilon_0 A_0}{d_0}$$

Thus, $$i_o \cong V_P \cdot \left( \frac{\varepsilon_0 A_0}{d_0} \right) \cdot \left( \frac{1}{d_0} \right) \cdot (\omega_0 X)$$
$$= V_P \cdot \frac{q}{V_P} \cdot \left( \frac{1}{d_0} \right) \cdot (\omega_0 X)$$
$$= \frac{q}{d_0} \cdot (\omega_0 X)$$

The resonator output signal is proportional to electronic charge. Thus, the semiconductor electrodes of a capacitive coupling resonator, consisting of a p-type semiconductor electrode and an n-type semiconductor electrode, can generate a larger output signal current than a resonator which has two semiconductor electrodes doped in the same way.

Thus, the resonator characteristics are improved, and the resonator is made more suitable for use in, for example, radio frequency applications, such as in integrated circuits for use in wireless communication devices. Further, this choice of doping does not imply any need for adding any special manufacturing steps or for substantially modifying the conventional manufacturing processes. In other words, standard semiconductor manufacturing processes can be used. Thus, this embodiment of the invention can be implemented directly in existing technologies, without any additional costs.

Another aspect of the invention relates to a method of manufacturing a flap resonator comprising a first electrode and a second electrode, the second electrode comprising a support part separated from an adjacent end of the first electrode by a dielectric part, and a beam part extending from said support part and over at least a part of a surface of the first electrode, whereby there is a gap between said beam part and said surface of the first electrode, whereby the first electrode and the second electrode are arranged so that when an electrical signal is applied to said electrodes, the beam part will vibrate producing a varying capacitance between said beam part and the first electrode.

The method comprises the steps of
  providing a first electrode layer, corresponding to the first electrode;
  depositing at least one dielectric layer over at least a part of said first electrode layer, covering at least a part of an end part of said first electrode layer;
  depositing a second electrode layer over at least a part of said at least one dielectric layer, so that the second electrode layer comprises a support part separated from said end of the first electrode layer by said at least one dielectric layer;
  removing a part of said at least one dielectric layer between said first electrode layer and said second electrode layer, so as to provide a beam part extending over at least a part of said first electrode layer and free to vibrate so as to produce a varying capacitance between said beam part and the first electrode, whereby said step of removing a part of said at least one dielectric layer between said first electrode layer and said second electrode layer is performed so that part of said at least one dielectric layer remains, constituting a dielectric part separating said support part of the second electrode, which supports the beam part, from the adjacent end of the first electrode.

According to this aspect of the invention, the second electrode layer is arranged so that, while the beam part has a first width in a direction parallel to its connection to the support part, the support part has an effective width in said direction, said effective width being smaller than said first width.

What has been said above in connection with the first aspect of the invention, is also applicable to the method aspect of the invention, mutatis mutandis.

The effective width of said support part can be made smaller than said first width by means of removing a corresponding portion of the second electrode layer in correspondence with said support part.

Alternatively, the effective width of said support part can be made smaller than said first width by means of applying said second electrode layer so that the effective width of said second electrode layer is smaller in correspondence with the support part than in correspondence with the beam part.

This can all be achieved using typical CMOS processing steps.

One or both of said first and second electrode layers can be made of doped silicon or polysilicon.

The at least one dielectric layer can be made of, for example, silicon dioxide.

The second electrode layer can be provided or treated so that a portion of it, constituting the support part, will comprise one single support portion that is continuous in a direction parallel to its connection to the beam part, whereby the effective width is the width of said single support portion.

As an alternative, the second electrode layer can be provided or treated so that a portion of it constituting the support part will comprise a plurality of support portions arranged along a direction parallel to their connection to the beam part, so that said support portions are separated from adjacent support portions by gaps, whereby the effective width becomes the sum of the widths of the plurality of support portions.

Said effective width can be less than 50% of the first width, for example, less tan 25% of the first width.

The second electrode layer can be provided so that the second electrode further comprises a base part extending from said support part.

The second electrode layer can be applied or treated so that the support part has said effective width, smaller that said first width, at least in a part of an area that is in contact with a remaining portion of the, at least one, dielectric layer, and/or in an area that is not in contact with said remaining portion of said, at least one, dielectric layer.

One of the first electrode and second electrode can be made of a p-type doped semiconductor material, whereas the other one of said first electrode and second electrode can be made of an n-type doped semiconductor material.

Another aspect of the invention relates to an integrated circuit for a radio frequency application, which comprises a plurality of circuit elements, including at least one resonator as described above and/or obtained by the method described above. Using this kind of resonator in an integrated circuit of this type provides for increased integration of the components of the radiofrequency application.

BRIEF DESCRIPTION OF THE DRAWINGS

To complete the description and in order to provide for a better understanding of the invention, a set of drawings is provided. Said drawings form an integral part of the description and illustrate preferred embodiments of the invention, which should not be interpreted as restricting the scope of the invention, but just as examples of how the invention can be embodied. The drawings comprise the following figures.

DESCRIPTION OF A PREFERRED EMBODIMENT OF THE INVENTION

Figure 3:
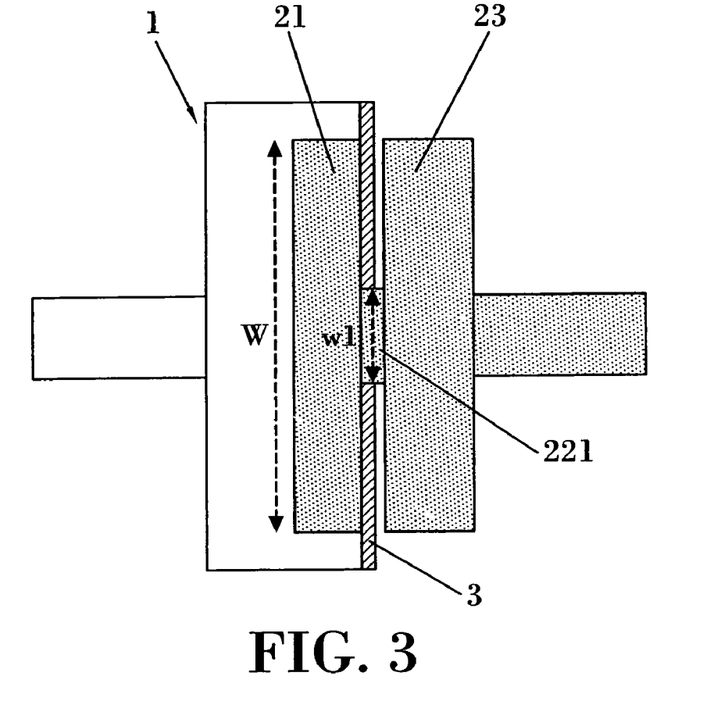
FIG. 3: a top view of a MEMS resonator in accordance with an embodiment of the invention.

FIG. 3 illustrates a flap resonator in accordance with a possible embodiment of the invention, comprising a first electrode 1 and a second electrode 2. The second electrode comprises a support part 221 separated from an adjacent end of the first electrode by a dielectric part 3, a beam part 21 extending from said support part and over a part of a surface of the first electrode 1, and a base part 23. There is a gap between said beam part 21 and the corresponding surface of the first electrode 1. The first electrode 1 and the second electrode 2 are arranged so that when an electrical signal is applied to said electrodes, the beam part will vibrate producing a varying capacitance between said beam part 21 and the first electrode 1. Now, in accordance with this embodiment, the beam part 21 has a first width (W) in a direction parallel to its connection to the support part 22, and the support part comprises one single support portion 221 that is continuous in a direction parallel to its connection to the beam part, whereby the effective width of the support part is the width (w1) of said single support portion, which is smaller than the above-mentioned first width (W) of the beam part. The single support portion 221 is situated centrally with regard to the extension of the beam part 21 along its width (W), thus providing a symmetric arrangement.

Figure 4:
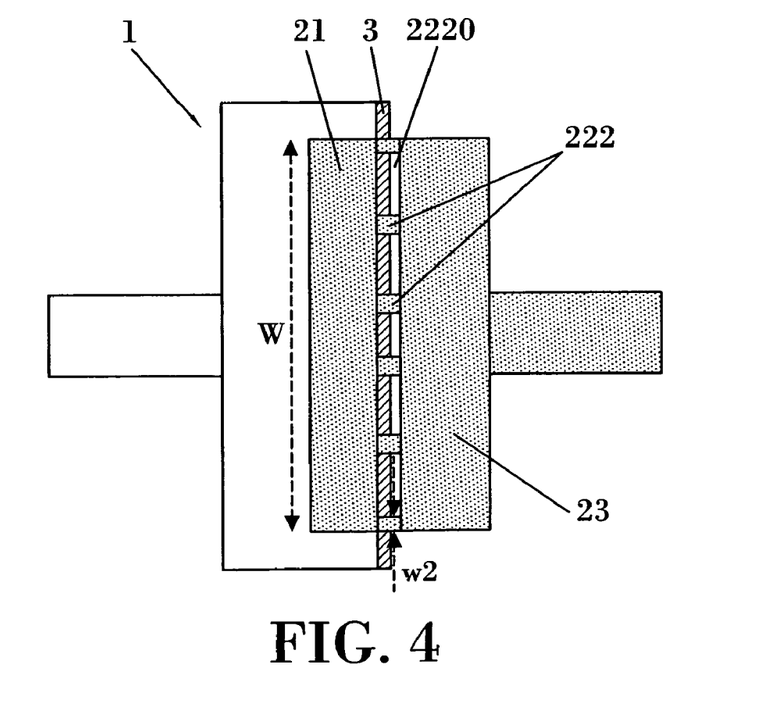
FIG. 4: a top view of a MEMS resonator in accordance with another embodiment of the invention.

FIG. 4 illustrates an alternative embodiment. Most of the components are the same as those of the embodiment illustrated in FIG. 3, and carry the same reference numerals. However, instead of the single support portion 221, in the embodiment of FIG. 4 the support part comprises a plurality of support portions 222 arranged in a row along a direction parallel to their connection to the beam part, said support portions being separated from adjacent support portions 222 by gaps 2220, whereby the effective width is the sum of the widths (w2) of each of the plurality of support portions. These portions can each have the same width, or there can be support portions having different widths.

FIGS. 5A-5E schematically illustrate one possible way of manufacturing a resonator in accordance with an embodiment of the invention. Basically, the fabrication process is based on standard CMOS technology, suitable for integrating the resonator into an integrated circuit.

Figure 5A:
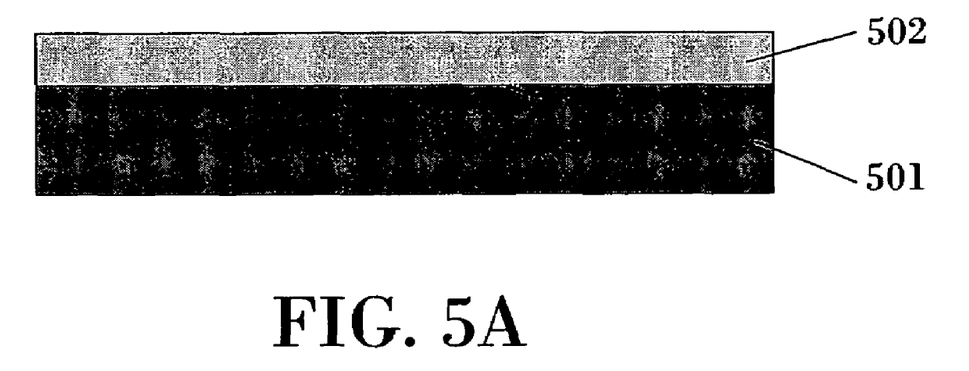
FIGS. 5A-5E: schematic illustrations in cross section of the resonator, during different steps of a manufacturing process.

FIG. 5A illustrates a structure obtained after a first step, in which a substrate wafer is provided, constituting a first silicon layer 501 (for instance, p or n type doped silicon), on which a first insulating or dielectric layer (such as a layer of silicon dioxide ($SiO_2$), also known as a field oxide layer) has been deposited, by thermal oxidization. The thickness of the dielectric layer 502 is typically around 10000 Å.

Figure 5B:
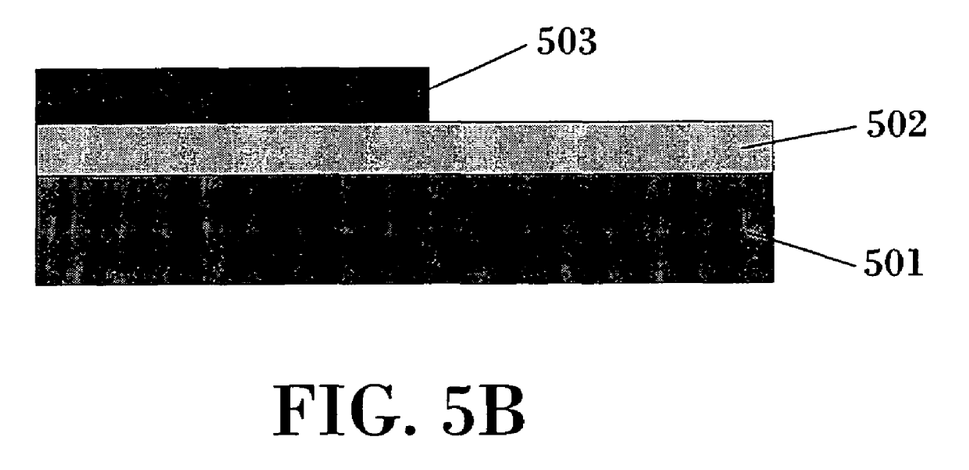

In FIG. 5B, a first polysilicon layer 503 has been deposited on part of the first dielectric layer 502, by CVD (Chemical Vapor Deposition). This first polysilicon layer is doped (for example, by p-type doping with boron (B), or by n-type doping with arsenic (As) or Phosphorous (P)), in order to reduce the resistivity of the polysilicon layer, by thermal diffusion or ion implantation. The wafer is then thermally annealed so as to maintain the uniformity of the doping. The thickness of this first polysilicon layer 503 is typically around 5000 Å (although the width of this layer is not important for this resonator fabrication process as, in this case, this first polysilicon layer will constitute the first electrode, which is not intended to vibrate, wherefore its dimensions are not particularly relevant).

Figure 5C:
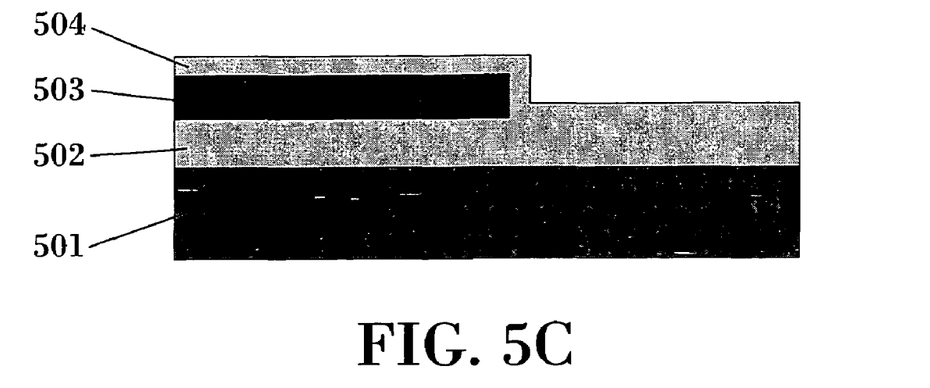

In FIG. 5C, a second dielectric (such as a silicon dioxide ($SiO_2$)) layer 504 has been added by thermal oxidization, in order to insulate the first polysilicon layer 503 from a subsequent polysilicon layer. Also, this second dielectric layer 504 acts as a general support or "anchor" part of the resonator. The thickness of this second dielectric layer 504 depends on the gap to be provided between the vertically overlapping parts of the resonator. Typically, the second dielectric layer can have a thickness less than 500 nm.

Figure 5D:
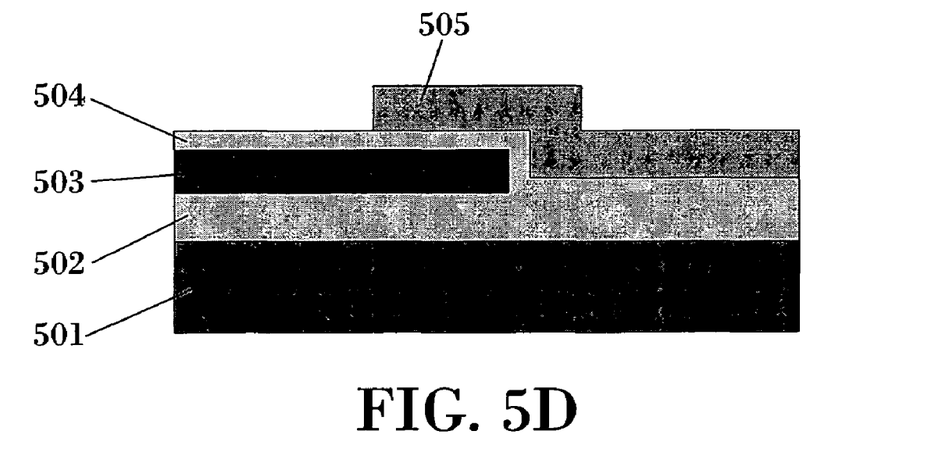

In FIG. 5D, a second polysilicon layer 505 has been deposited on part of the second dielectric layer 504, by CVD. This second polysilicon layer 505 is doped (for example, by p-type doping with boron (B), or by n-type doping with arsenic (As) or Phosphorous (P); if the first polysilicon layer is p-type doped, the second polysilicon layer can be n-type doped, and vice-versa, as opposite type of dopings can provide for a larger output signal current from the resonator, cf. what has been stated above), in order to reduce the resistivity of the polysilicon layer, by thermal diffusion or ion implantation. The wafer is then annealed so as to maintain the uniformity of the doping. The thickness of this second polysilicon layer 505 is selected in accordance with the desired characteristics of the resonator (the thickness of this layer is an important parameter which strongly influences the resonator characteristics). Typically, the second polysilicon layer can have a thickness between 500 nm and 2000 nm (however, thick polysilicon layers can be more difficult to fabricate and not compatible with standard CMOS manufacturing processes).

In a subsequent step, the so-called "post process" step, the sacrificial layer (namely, part of the second dielectric layer 504) is removed in order to activate the resonator, by means of letting the beam part (corresponding to a part of the second polysilicon layer 505) become free, except for where it is connected to the support part, also constituted by the second polysilicon layer 505. Post process release etching can be done using a hydrofluoric acid release solution (this solution is typically used for removing a silicon dioxide sacrificial layer). The etching time depends on the length of the second dielectric layer 504 that is to be removed.

Figure 5E:
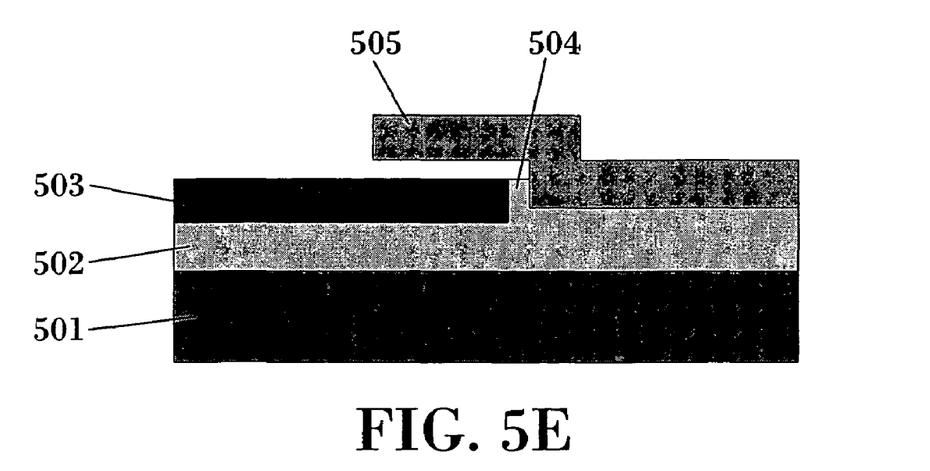

In FIG. 5E, it can be observed how a part of the second dielectric layer 504 remains, constituting a dielectric part or strip between the first polysilicon layer 503 (corresponding to the first electrode of the invention) and a part of the second polysilicon layer 505 (corresponding to the support portion of the second electrode). This part of the second dielectric layer provides a dielectric part or strip between the first and second electrodes (corresponding to the first 503 and second 505 polysilicon layers, respectively), and contributes substantially to the capacitance between the two electrodes. Thus, by reducing the width of the support part of the second electrode, or at least of the part of said support part that is in contact with this dielectric strip (that is, with the corresponding remaining part of the second dielectric layer 504 between the first and second electrodes), the capacitance can be reduced. This width can be reduced by carrying out the above-mentioned step of applying the second polysilicon layer 505 so that said second polysilicon layer 505, in correspondence with said support part, features a reduced width or "effective width", compared to the width of the beam part. This can be done by applying the second polysilicon layer 505 so that, in correspondence with the support part, the polysilicon layer 505 comprises

- one single portion 221 having a smaller width than the width of the beam part (namely, the width w1 as illustrated in FIG. 3), or
- a plurality of portions 222 separated by gaps 2220, whereby each portion has a width w2 (cf. FIG. 4) chosen so that the sum of the widths of said plurality of portions is smaller than the width of the beam part.

This can be achieved by applying a continuous polysilicon layer 505 and thereafter removing parts of it by etching, or by applying the second polysilicon layer over a mask that keeps the relevant areas free from polysilicon, thus providing the support portion as per the invention. This can be performed using, for example, conventional CMOS process steps.

Of course, an alternative approach for modifying the capacitance of the resonator circuit could be by further deleting the second dielectric layer 504, thus removing said second dielectric layer 504 between the first and second electrodes in correspondence with said support part. However, removing said second dielectric layer 504 also where the support part is separated from the first electrode would imply that the support part would no longer be supported by said second dielectric layer. Thus, also the support part would be able to vibrate with the beam, thus substantially altering the mechanical behavior of the resonator, which is not desired.

Figure 6:
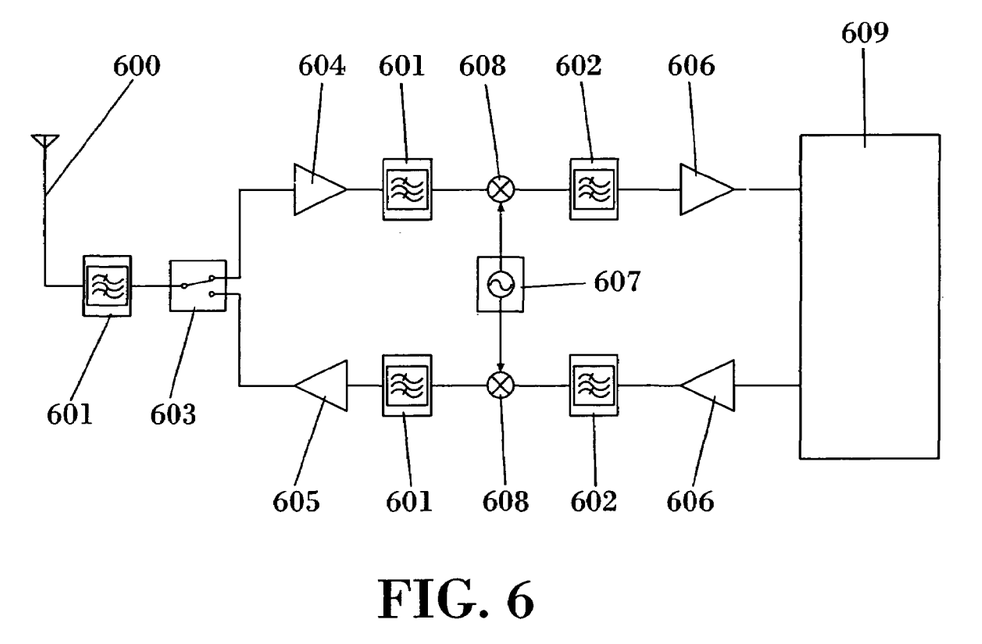
FIG. 6: Schematic illustration of a circuit for a radio frequency application, including resonators according to the invention.

FIG. 6 shows an integrated circuit for a radio frequency application, namely, a transceiver module connected to an antenna 600. The transceiver module comprises a plurality of band-pass filters 601, intermediate frequency band-pass filters 602, an Rx/Tx switch 603, a low noise amplifier 604, a power amplifier 605, intermediate frequency amplifiers 606, a local oscillator 607, frequency conversion mixers 608 and a base band block 609. This circuit configuration is conventional in this kind of applications. However, in accordance with the invention, one or more of the band-pass filters (601, 602) and the local oscillator can be based on resonators in accordance with the invention, integrated in a circuit comprising the other elements, optionally even the antenna 600.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. A flap resonator, comprising a first electrode and a second electrode, the second electrode comprising a support part separated from an adjacent end of the first electrode by a dielectric part, and a beam part extending from said support part and over at least a part of a surface of the first electrode, whereby there is a gap between said beam part and said surface of the first electrode, whereby the first electrode and the second electrode are arranged so that when an electrical signal is applied to said electrodes, the beam part will vibrate producing a varying capacitance between said beam part and the first electrode;

wherein the beam part has a first width in a direction parallel to its connection to the support part; and the support part has an effective width in said direction, said effective width being less than 50% of said first width.

2. The flap resonator according to claim 1, wherein the support part comprises one single support portion that is continuous in a direction parallel to its connection to the beam part, whereby the effective width is the width of said single support portion.

3. The flap resonator according to claim 2, wherein the single support portion is situated centrally with regard to the extension of the beam part along its width.

4. The flap resonator according to claim 1, wherein the support part comprises a plurality of support portions arranged along a direction parallel to their connection to the beam part, said support portions being separated from adjacent support portions by gaps, whereby the effective width is the sum of the widths of the plurality of support portions.

5. The flap resonator according to claim 1, wherein said effective width is less than 25% of the first width.

6. The flap resonator according to claim 1, wherein the second electrode further comprises a base part extending from said support part.

7. The flap resonator according to claim 1, wherein the support part has said effective width, smaller that said first width, at least in a part of an area that is in contact with the dielectric part.

8. The flap resonator according to claim 1, wherein said dielectric part is a part of a layer electrically insulating said second electrode with regard to said first electrode.

9. The flap resonator according to claim 1, wherein the first electrode is made of silicon or polysilicon and wherein the second electrode is made of silicon or polysilicon.

10. The flap resonator according to claim 1, wherein the dielectric part is made of silicon dioxide.

11. The flap resonator according to claim 1, wherein one of the first electrode and second electrode is made of a p-type doped semiconductor material, whereas the other one of said first electrode and second electrode is made of an n-type doped semiconductor material.

12. A flap resonator, comprising a first electrode and a second electrode, the second electrode comprising a support part separated from an adjacent end of the first electrode by a dielectric part, and a beam part extending from said support part and over at least a part of a surface of the first electrode, whereby there is a gap between said beam part and said surface of the first electrode, whereby the first electrode and the second electrode are arranged so that when an electrical signal is applied to said electrodes, the beam part will vibrate producing a varying capacitance between said beam part and the first electrode;

wherein the beam part has a first width in a direction parallel to its connection to the support part;

the support part has an effective width in said direction, said effective width being smaller than said first width; and the support part has said effective width, smaller that said first width, at least in a part of an area that is not in contact with the dielectric part.

13. The flap resonator according to claim 12, wherein the support part comprises one single support portion that is continuous in a direction parallel to its connection to the beam part, whereby the effective width is the width of said single support portion.

14. The flap resonator according to claim 12, wherein the single support portion is situated centrally with regard to the extension of the beam part along its width.

15. The flap resonator according to claim 12, wherein the support part comprises a plurality of support portions arranged along a direction parallel to their connection to the beam part, said support portions being separated from adjacent support portions by gaps, whereby the effective width is the sum of the widths of the plurality of support portions.

16. The flap resonator according to claim 12, wherein the second electrode further comprises a base part extending from said support part.

17. The flap resonator according to claim 12, wherein said dielectric part is a part of a layer electrically insulating said second electrode with regard to said first electrode.

18. The flap resonator according to claim 12, wherein the first electrode is made of silicon or polysilicon and wherein the second electrode is made of silicon or polysilicon.

19. The flap resonator according to claim 12, wherein the dielectric part is made of silicon dioxide.

20. The flap resonator according to claim 12, wherein one of the first electrode and second electrode is made of a p-type doped semiconductor material, whereas the other one of said first electrode and second electrode is made of an n-type doped semiconductor material.

* * * * *